United States Patent [19]

Sheng et al.

[11] Patent Number: 5,498,594
[45] Date of Patent: Mar. 12, 1996

[54] (HG OR PB)-PR-TL-SR-CU-O BASED SUPERCONDUCTORS

[75] Inventors: Zhengzhi Sheng; John Meason; Ying Xin, all of Fayetteville, Ark.

[73] Assignee: University of Arkansas, Little Rock, Ark.

[21] Appl. No.: 198,214

[22] Filed: Feb. 17, 1994

Related U.S. Application Data

[63] Continuation of Ser. No. 865,669, Apr. 8, 1992, abandoned, which is a continuation of Ser. No. 581,324, Sep. 12, 1990, abandoned.

[51] Int. Cl.$^6$ .......................... H01L 39/12; C04B 35/45; C04B 35/50
[52] U.S. Cl. .................. 505/120; 505/779; 505/783; 505/126; 423/263; 423/593; 252/521; 501/126; 501/127
[58] Field of Search .................. 505/779, 783, 505/120, 126; 423/263, 600, 604, 593; 252/521; 501/126, 127

[56] References Cited

U.S. PATENT DOCUMENTS

| | | | |
|---|---|---|---|
| 4,755,493 | 7/1988 | Takeuchi et al. | 501/134 |
| 4,870,052 | 9/1989 | Engler et al. | 505/1 |
| 4,880,773 | 11/1989 | Itozaki et al. | 505/1 |

FOREIGN PATENT DOCUMENTS

| | | |
|---|---|---|
| 0284062 | 9/1988 | European Pat. Off. . |
| 0280812 | 9/1988 | European Pat. Off. . |
| 0286289 | 10/1988 | European Pat. Off. . |
| 0292340 | 11/1988 | European Pat. Off. . |
| 0301952 | 2/1989 | European Pat. Off. . |
| 0301958 | 2/1989 | European Pat. Off. . |
| 0316009 | 5/1989 | European Pat. Off. . |
| 0443827 | 8/1991 | European Pat. Off. . |
| 0116619 | 5/1990 | Japan . |

OTHER PUBLICATIONS

Itoh et al, "Superconductivity in the Tl–Nd–Sr–Cu–O and the Tl–Pb–Nd–Sr–Cu–O Systems", Phys. Rev. B vol. 39, No. 7, 1 Mar. 1989, pp. 4690–4692.
Itoh et al, "Superconductivity of New Compounds in the Systems Tl–Ln–Sr–Cu–O (Ln=Pr and Nd) and Tl–Pb–Ln–Sr–Cu–O . . . ", J.J.A.P. vol. 28, No. 2, Mar. 6, 1989, pp. L200–L202.
Adachi et al, "Superconductivity in a Tl–Pb–Pr–Sr–Cu–O System," J.J.A.P. vol. 28, No. 5, May 24, 1989, pp. L775–L777.
Tajima et al, "Composition Dependence of the Physical Properties in the Superconductor Y–Ba–Cu–O System," J.J.A.P. vol. 26, No. 5 May 1987, pp. L845–L847.
Sheng et al, "Superconductivity above 100K in the Ca-free Tl–Pb–Sr–Pr–Cu–O System," Physica C vol. 172, 1 Dec. 1990, pp. 43–46.
Subramanian et al, "Bulk Superconductivity up to 122K in the Tl–Pb–Sr–Ca–CuO System," Science vol. 242, 14 Oct. 1988, pp. 249–252.
Hasegawa, T., et al., High T. Superconductivity of $(La_{1-x}Sr_x$ $CuO_4$—Effect of Substition . . . Superconductivity, Japan Journal of Applied Physics, vol. 26, No. 4, Apr. 20, 1987, L337–L338.
Kishio, K., et al., Effect of Lanthanide Ion Substitutions for Lanthanum Sites on Superconductivity of $(La_{1-x}Sr_x)_2CuO_{4-\delta}$ Japanese Journal of Applied Physics, vol. 26, No. 4, Apr. 20, 1987, L391–L393.
Ohshima, S., et al., Superconducting and Structural Properties of the New $Ba_{1-x}Ln_xCuO_{3-y}$ Compound System (Ln= La, Ce, Pr, Nd, Sm, Eu, . . . and Yb), Japanese Journal of Applied Physics, vol. 26 No. 5, May 1987, L815–L817.
Tsurumi, S., et al., High T. Superconductivities of $A_2Ba_4Cu_6O_{14+y}$ Japanese Journal of Applied Physics, vol. 26, No. 5, May 1987, L856–L857.
Superconductivity News, vol. 1, No. 2, Aug. 1987, pp. 1, 2 and 6–8.
Yang, K. N., et al., High Temperature Superconductivity in Rare–Earth (R)–Barium Copper Oxides $(RBa_2)Cu_3O_{3-\delta}$, Solid State Communications, vol. 63, No. 6, 1987, pp. 515–519.
Tarascon, J. M., et al., Oxygen and Rare–Earth Doping of the 90–K Superconducting Perovskite $YBa_2Cu_3O_{7-x}$, Physical Review B, vol. 36, No. 1, 1987, 226–234.
Hor, P. H., et al., Superconductivity Above 90 K in the Square–Planar Compound System $ABa_2Cu_3O_{6+x}$ with A=Y, La, Nd, Sm, Eu, Gd, Ho, Er, and Lu, Physical Review Letters, vol. 58, No. 18, 1987, 1891–1894.
Khurana, A., Superconductivity Seen Above the Boiling Point of Nitrogen, Physics Today, Apr., 1987, 17–23.
Cava, R. J., et al., Bulk Superconductivity at 91 K in Single–Phase Oxygen–Deficient Perovskite $Ba_2YCu_3O_{9-\delta}$, Physical Review Letters, vol. 58, No. 16, 1987, 1676–1679.
Nagashima, T., et al., Superconductivity in $Tl_{1.5}SrCaCu_2O_x$, Japanese Journal of Applied Physics, vol. 27, No. 6, Jun., 1988, L1077–L1079.
Saito, Y., et al. High–$T_c$ Superconducting Properties in $(Y_{1-x}Tl_x)Ba_2Cu_3O_{7-y}$, $Y(Ba_{1-x}K_x)_2Cu_3O_{7-y}$ and $YBa_2(Cu_{1-x}Mg_x)_3O_{7-y}$, Physica 148B, 1987, 336–338.
Kondoh, S., et al., Superconductivity in Tl–Ba–Cu–O System, Solid State Communications, vol. 65, No. 11, 1988, 1329–1331.
Sera, M. et al., On the Structure of High–$T_c$ Oxide System Tl–Ba–Cu–O, Institute for Molecular Science, Myodaiji, Okasaki 444 Japan, 1988.
Ihara, H. et al., Possibility of Superconductivity at 65° C. in (List continued on next page.)

Primary Examiner—Douglas J. McGinty
Attorney, Agent, or Firm—Hermann Ivester; Hill, Steadman & Simpson

[57] ABSTRACT

A high temperature superconducting system comprising M—R—Tl—Sr—Cu—O wherein: M is at least one compound selected from the group consisting of Hg, Pb, K, and Al; and R represents rare earth metals. In one embodiment, a composition forms a 93K superconducting phase having the composition: M—R—Tl—Sr—Cu—O wherein: M is selected from the group consisting of Hg and Al; and R is a rare earth metal. In another embodiment, the composition comprises M—R—Tl—Sr—Cu—O wherein: M is selected from the group of Pb and/or K; and R is a rare earth metal.

2 Claims, 2 Drawing Sheets

OTHER PUBLICATIONS

Sr–Ba–Y–Cu–O System, Japanese Journal of Applied Physics, vol. 26, No. 8, Aug., 1987, L1413–L1415.

Ishida, T., *Compositional Variation of High $T_c$ in $Yb_xEr_{1-x}Ba_2Cu_3O_{6+y}$ System*, Japanese Journal of Applied Physics, vol. 26, No. 8, Aug. 1987, L1294–L1295.

Kijima, T., et al., *Superconductivity in the Bi–Sr–La–Cu–O System*, Japanese Journal of Applied Physics, vol. 27, No. 6, Jun., 1988, L1035–L1037.

Richert, B., et al., *Atomic Substitution in $YBa_2Cu_3O_7$: Modification of the Electronic Structure*, American Institute of Physics Conference Proceedings No. 165 (Thin Film Processing and Characterization of High–Temperature Superconductors), Nov. 6, 1987, 277–283.

Lee, B. W., et al., *Long–range Magnetic Ordering the High–$T_c$ Superconductors $RBa_2Cu_3O_{7-\delta}$(R=Nd, Sm, Gd, Dy and Er)*, Physical Review B, vol. 37, No. 4, Feb. 1, 1988, 2368–2371.

Shih, I., et al., *Multilayer Deposition of Thallium Barium Calcium Copper Oxide Films*, Applied Physics Letter 53(6), 1988, 523–525.

Ginley, D. S., et al., *Sequential Electron Beam Evaporated Films of $Tl_2CaBa_2Cu_2O_y$ with Zero resistance at 97 K*, Applied Physics Letters, 53 (5), Aug. 1, 1988, 406–408.

Qiu, C. X., et al., *Formation of Tl–Ca–Ba—Cu–O Films by Diffusion of Tl into rf–sputtered Ca–Ba–Cu–O*, Applied Physics Letters, 53 (12), Sep. 19, 1988, 1122–1124.

Gopalakrishnan, I. K., et al., *Synthesis and Properties of a 125 K Superconductor in the Tl–Ca–Ba–Cu–O System*, Applied Physics Letters, 53 (5), Aug. 1, 1988, 414–416.

Parkin, S. S. P., et al., *Bulk Superconductivity at 125 K in $Tl_2Ca_2Ba_2Cu_3O_x$*, Physical Review, 1988, 2539–2542.

Sheng, Z. Z., et al., *Superconductivity in the Rare–Earth–Free Tl–Ba–Cu–O System Above Liquid–Nitrogen Temperature*, Nature, vol. 332, Mar. 3, 1988, 55–58.

Sheng, Z. Z., et al., *Superconductivity at 90 K in the Tl–Ba–Cu–O System.*, Physical Review Letters, vol. 60, No. 10, Mar. 7, 1988, 937–940.

Sheng, Z. Z., et al., *Bulk Superconductivity at 120 K in the Tl–Ca/Ba–Cu–O System*, Nature, vol. 332, Mar. 10, 1988, 138–139.

Ihara, H., et al., *A New High–$T_c$ $TlBa_2Ca_3Cu_4O_{11}$ Superconductor with $T_c>120 K$*, Nature, vol. 334 11 Aug. 1988, 510–511.

Sheng, Z. Z., et al., *$Tl_2O_3$ Vapor Process of Making Tl–Ba–Ca–Cu–O Superconductors*, Appl. Phys. Lett. 53 (26), 26 Dec. 1988, 2686–2688.

Hazen, R. M., et al., *100–K Superconducting Phases in the Tl–Ca–Ba–Cu–O System*, Physical Review Letters, vol. 60, No. 16, 18 Apr. 1988, 1657–1660.

Sheng, Z. Z., et al., *New 120 K Tl–Ca–Ba–Cu–O Superconductor*, Appl. Phys. Lett., vol. 52, No. 20, 16 May 1988, 1738–1740.

Lin, R. J., et al., *Forming Superconducting Tl–Ca–Ba–Cu–O Thin Films by the Diffusion Method*, Japanese Journal of Applied Physics, vol. 28, No. 1, Jan., 1989, L85–L87.

Johs, B., et al., *Preparation of High $T_c$ Tl–Ba–Ca–Cu–O Thin Films by Pulsed Laser Evaporation and $Tl_2O_3$ Vapor Processing*, Appl. Phys. Lett. 54(18), 1 May 1989, 1810–1811.

Sugise, R., et al., *Preparation of $Tl_2Ba_2Ca_2Cu_3O_y$ Thick Films from Ba—Ca–Cu–O Films*, Japanese Journal of Applied Physics, vol. 27, No. 12, Dec., 1988, L2314–L2316.

Hatta, S., et al., *Pt–coated Substrate Effect on Oxide Superconductive Films in Low–Temperature Processing*, Appl. Phys. Lett. 53 (2), 11 Jul. 1988, 148–150.

Lee, W. Y., et al., *Superconducting Tl–Ca–Ba–Cu–O Thin Films With Zero Resistance at Temperatures of up to 120 K*, Appl. Phys. Lett 53 (4), 25 Jul. 1988, 329–331.

Oota, A., et al., *Electrical, Magnetic and Superconducting Properties of High–$T_c$ Superconductor (Y, Sc)–(Ba, Sr)–Cu Oxide*, Japanese Journal of Appl Physics, vol. 26, No. 8, Aug., 1987, L1356–1358.

Iwazumi, T., et al., *Identification of a Structure with Two Superconducting Phases in L–Ba–Cu–O System (L=La or Y)*, Japanese Journal of Applied Physics, vol. 26, No. 5, May, 1987, L621–L623.

Capone, II., D. W., et al., *Super Critical Fields and High Superconducting Transition Temperatures of $La_{1.85}Sr_{0.15}CuO_4$ and $La_{1.85}Ba_{0.15}CuO_4$*, Appl. Phys. Lett 50 (9), 2 Mar. 1987, 543–544.

Johnson, D. W., et al., *Fabrication of Ceramic Articles from High $T_c$ Superconducting Oxides*, Materials Research Society, Symposium S Proceedings (High Temperature Superconductors), Apr. 1987, 193–195.

Garwin, L., *Superconducting Conference Yields New Temperature Record*, Nature vol. 332 10 Mar. 1988.

Suzuki, A., et al., *Rare– Earth(RE)—Barium Solubility Behavior in $Y(Ba_{z-x}RE_x)Cu_3O_{7+\delta}$ and $Sm(Ba_{z-x}Re_x)Cu_3O_{7+\delta}$*, Japanese Journal of Applied Physics, vol. 27, No. 5, May, 1988, L792–L794.

Nagashima, T., et al., *Improving Superconducting Characteristics of Tl–Sr–Ca–Cu–O by Doping with Pb and/or Rare–Earth Elements*, Japanese Journal of Applied Physics, vol. 28, No. 6, Jun. 1989, L930–L933.

Vijayaraghavan, R., et al., *Investigations of Novel Cuprates of the $Tl_{Ca_{1-x}}Ln_xSr_2O_{7-\delta}$(Ln=rare earth) Series Showing Electron–or Hole–superconductivity Depending on the Composition*, Superconducting Science and Technology, vol. 2(3), Sep. 1989, 195–201.

Inoue, O., et al., *Superconductivity in a Tl–Sr–Y–Cu–O System*, Japanese Journal of Applied Physics, vol. 28, No. 8, Aug. 1989, L1375–L1377.

Peters, P. N., et al., *Observation of Enhanced Properties in Samples of Silver Oxide Doped $YBa_2Cu_3O_x$*, Appl. Phys. Lett 52 (24), 13 Jun. 1988, 2066–2067.

S. Natarajan et al., *Superconductivity Studies on $(Y_{1-x}Ln_x)Ba_2Cu_3O_7$, Ln=La,Pr,Tb*, Physica C, vol. 153–155, Feb. 1988, 926–927.

D. D. Sarma, et al., *Electronic Structure of High–$T_c$ Superconductors from Soft–x–ray Absorption*, Physical Review B, vol. 37, No. 16, Jun. 1988, 9784–9787.

K. Kishio, et al., *Superconductivity Achieved at Over Liquid Nitrogen Temperature by (Mixed Rare Earths)–Ba–Cu Oxides*, Japanese Journal of Applied Physics, vol. 26 No. 5, May 1987, L694–L696.

Waldrop, M. Mitchell, *Thallium Superconductor Reaches 125K*, Research News, Mar. 1988, 1243.

Qadri, S. B., et al., *X–ray Identification of the Superconducting High–$T_c$ Phase in the Y–Ba–Cu–O System*, Physical Review B, vol. 35, No. 13, 1987.

Murphy, D. W., et al., *New Superconducting Cuprate Perovskites*, Physical Review Letters, vol. 58, May 1987, 1888–1890.

World Patents Index Latest, Week 9043, AN 90–323630 and JP–A–2 229 718 (Matsushita Elec. Ind. KK), Sep. 12, 1990, Abstract.

Sheng, Z. Z., et al., "90 K superconducting phase in the R–Tl–Sr–Cu–O systems with R=rare earths", *Mod. Phys. Lett. B*, 4(15) (20 Aug. 1990), 967–73.

Chemical Abstracts, registry No. 132852–12–1, 1995.

(HG OR PB)-PR-TL-SR-CU-O BASED SUPERCONDUCTORS

This is a continuation of application Ser. No. 07/865,669, filed Apr. 8, 1992, now abandoned, which is a continuation of application Ser. No. 07/581,324, filed Sep. 12, 1990 now abandoned.

BACKGROUND OF THE INVENTION

The present invention relates to high temperature superconducting systems and the processes for making same.

A variety of high temperature superconducting systems have been developed. Such superconducting systems include: Y—Ba—Cu—O; Bi—Sr—Ca—Cu—O; Tl—Ba—Cu—O; and Tl—Ba—Ca—Cu—O. A number of such systems are set forth in pending patent applications of which one of the inventors of the present invention is a coinventor.

For example, U.S. Pat. No. 4,962,083 discloses Tl—Ba—Ca—Cu—O superconductors and processes for making same. Additionally, that application discloses TlSrBaCuO superconductors and processes for making same. U.S. Pat. No. 4,994,432 discloses TlBaCuO superconductors and processes for making same. U.S. Pat. No. 5,036,044 discloses RTlSrCaCuO superconductors and process for making same, wherein R is a rare earth metal. U.S. Pat. No. 5,164,362 discloses TlSrCaCuO superconductors and processes for making same.

Despite the existence of known superconducting systems, and the fact that the above-identified patent applications provide superconductors and methods for making same, new superconducting systems are desirable for several reasons. A new system could provide a basis for the discovery of higher-temperature superconductors. In turn, higher-temperature superconductors could provide low cost processing and manufacturing.

SUMMARY OF THE INVENTION

The present invention provides a composition having superconductive properties comprising M—R—Tl—Sr—Cu—O, wherein R represents rare earth metals and M is at least one compound selected from the group consisting of Hg, Pb, K, and Al.

In an embodiment, the present invention provides a composition having superconductive properties at a temperature of approximately 93K comprising M—R—Tl—Sr—Cu—O wherein:

R is selected from the rare earth metals; and

M is selected from the group consisting of Hg and Al.

In another embodiment, the present invention provides a composition having a Tc of at least approximately 93K to approximately 100K. The composition comprising M—R—Tl—Sr—Cu—O wherein:

R is Pr; and

M is at least one element selected from the group consisting of Pb and K.

In an embodiment, the invention provides a material having superconductive properties having the nominal composition $HgPr_2Tl_2Sr_2Cu_3O_{12}$.

In an embodiment, the invention provides a material having superconductive properties having the nominal composition $HgPr_2Tl_2Sr_3Cu_3O_{13}$.

In an embodiment, the invention provides a material having superconductive properties having the nominal composition $Pb_{0.5}Pr_2Tl_2Sr_3Cu_3O_{13}$.

In an embodiment, the invention provides a material having superconductive properties having the nominal composition $KPb_{0.5}Pr_2Tl_2Sr_3Cu_3O_{13}$.

In a further embodiment, the present invention provides a method of preparing the high-temperature superconductors. The method includes the steps of: mixing together the components of the composition; and heating the mixture.

In an embodiment, the mixture is heated at a temperature of approximately 1000° C. for about 5 minutes in flowing oxygen.

In an embodiment, the mixture is pressed into a pellet prior to being heated.

Additional features and advantages of the present invention are further described, and will be apparent from the detailed description of the presently preferred embodiments and from the drawings.

DETAILED DESCRIPTION OF THE PRESENTLY PREFERRED EMBODIMENTS

The present invention provides new high-temperature superconductors and the processes for making them. To this end, the present invention provides a composition having super-conductive properties comprising the elements:

M—R—Tl—Sr—Cu—O wherein:

M is at least one compound selected from the group consisting of Hg, Pb, K, and Al; and R is selected from the group consisting of rare earth metals.

In an embodiment, R is Pr. In a further embodiment, R is Pr and M is Pb and/or K.

The inventors of the present invention have found that particular elemental dopings with Hg, Al, Pb, and/or K into a Pr— Tl—Sr—Cu—O system results in a compound having a higher Tc. Specifically, Hg- or Al-doping produced a 93K superconducting phase, while Pb- or K-doping increased the temperature from 93K to 100K.

The present invention also provides methods for preparing high-temperature superconductors. Pursuant to the present invention, samples are prepared by mixing the components and heating the mixture in flowing oxygen. For example, compounds selected from the group consisting of HgO, $Al_2O_3$, $PbO_2$, $KO_2$, $RE_2O_3$ (RE=rare earths), $Tl_2O_3$, SrO or $Sr(NO_3)_2$, and CuO can be mixed to achieve the desired composition.

In an embodiment of the procedure, the components are completely mixed, ground, and pressed into a pellet having a diameter of 7 mm and a thickness of 1–2 mm. The pellet is then heated in a tube furnace at a temperature of approximately 1000° C. for about 5 minutes in flowing oxygen. The pellet can then be subjected to furnace-cooling or quenching.

By way of example, and not limitation, examples of the superconducting composition and processes for making them are set forth below. For analyzing the resultant compositions created in the examples, resistance (ac, 27 Hz) was measured by a standard four-probe technique with silver paste contacts. All measurements were performed in a commercial APD refrigerator with computer control and processing.

EXAMPLE 1

A nominal $Pr_2Tl_2Sr_2Cu_3O_{11}$ Sample (A) and a nominal $HgPr_2Tl_2Sr_2Cu_3O_{12}$ Sample (B) were prepared according to the above method. The pellet was heated in a tube furnace at approximately 925° C.

Figure 1:
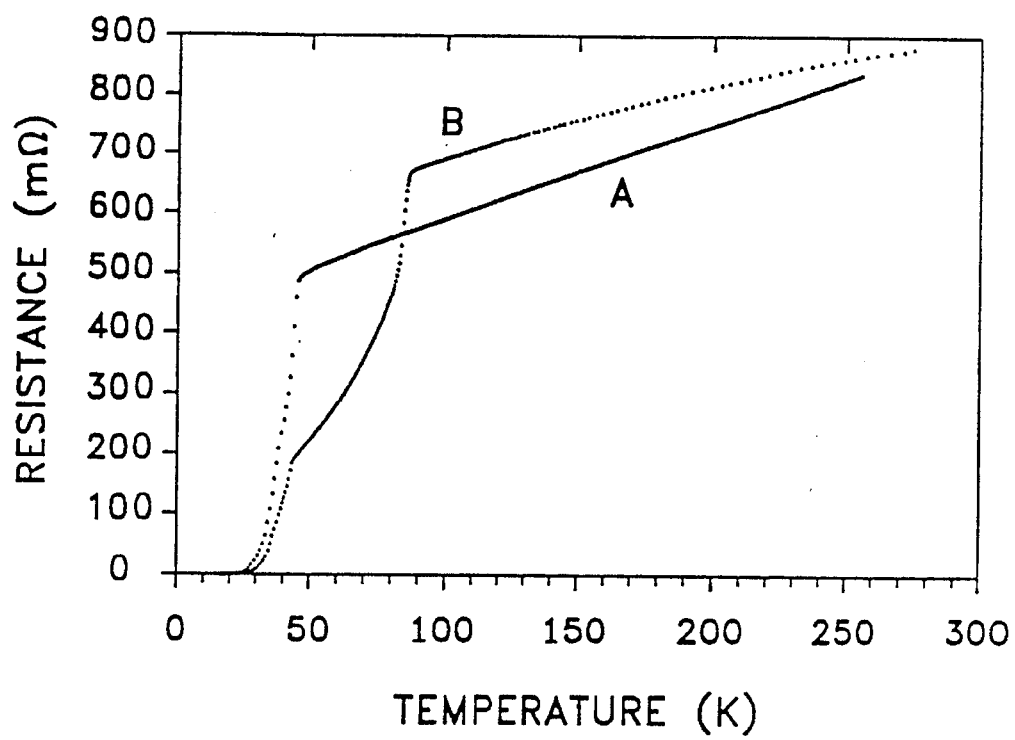
FIG. 1 illustrates resistance versus temperature for a nominal $Pr_2Tl_2Sr_2Cu_3O_{11}$ sample (designated "A") and for a nominal $HgPr_2Tl_2Sr_2Cu_3O_{12}$ sample (designated "B"). Both samples were prepared at 925° C.

FIG. 1 illustrates the resistance-temperature dependence for Sample A and Sample B. While Sample A had an onset temperature of 45K, Sample B exhibited a two-step transition at 88K and 43K, respectively. These results indicate that the addition of HgO facilitated the formation of a new superconducting phase with higher temperatures (approximately 90K). As set forth in Example 2, the superconducting behavior of the Hg—Pr—Tl—Sr—Cu—O samples was further enhanced by increasing the preparation temperature.

EXAMPLE 2

Two nominal $HgPr_2Tl_2Sr_3Cu_3O_{13}$ Samples (C and D) were prepared at a higher temperature, by the method previously described, except that the temperature of the furnace was heated to approximately 1000° C. Sample C was then furnace-cooled to 700° C. and remained at this temperature for 6 minutes. Sample D, on the other hand, was then furnace-cooled to room temperature.

Figure 2:
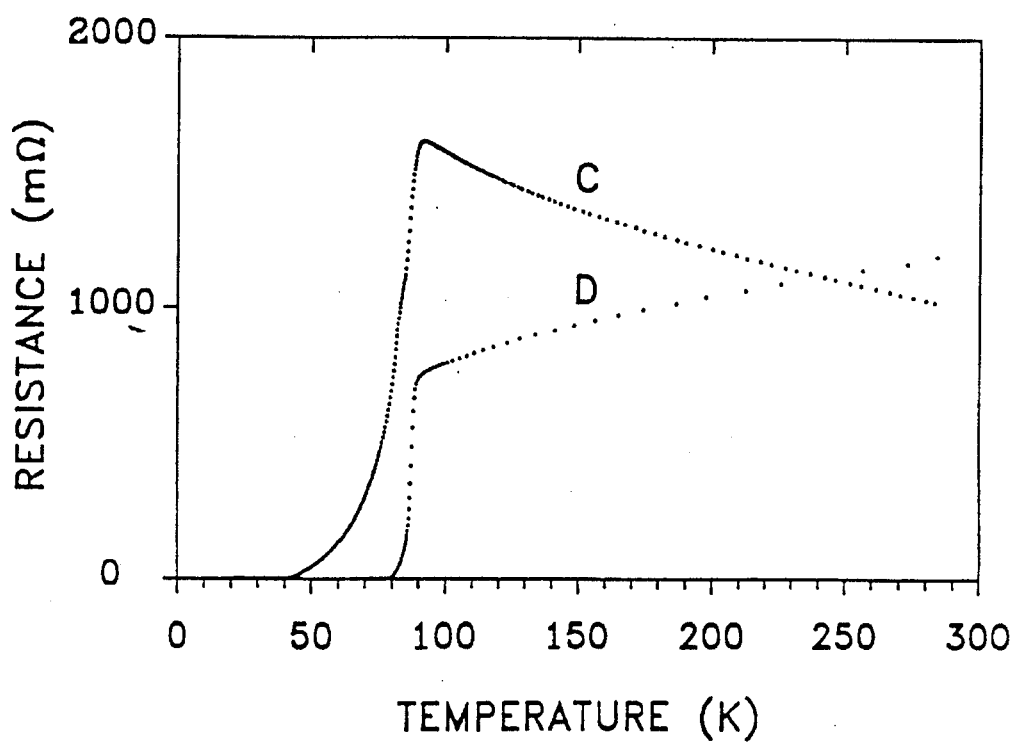
FIG. 2 illustrates resistance versus temperature for two nominal $HgPr_2Tl_2Sr_3Cu_3O_{13}$ samples (designated "C" and "D"). Both samples were prepared at 1000° C.

As illustrated in FIG. 2, Sample C exhibited a semimetallic resistance-temperature behavior at the normal state. It had an onset temperature of 93K, and a zero-resistance temperature of 40K. Sample D had a similar onset temperature to Sample C, but reached zero-resistance at a much higher temperature (78K). Although not illustrated, Al-doping samples also exhibited a superconducting behavior similar to the Hg-doping samples.

The results suggest to the inventors that: 1) either Hg or Al does not form a lattice in the superconducting phase, but only promotes the formation of the 93K superconducting phase; or 2) Hg or Al enters into the lattice but does not influence the conductivity temperature.

EXAMPLE 3

Pb-doping Pr—Tl—Sr—Cu—O samples exhibited different superconducting behavior as compared to the other doping elements.

Figure 3:
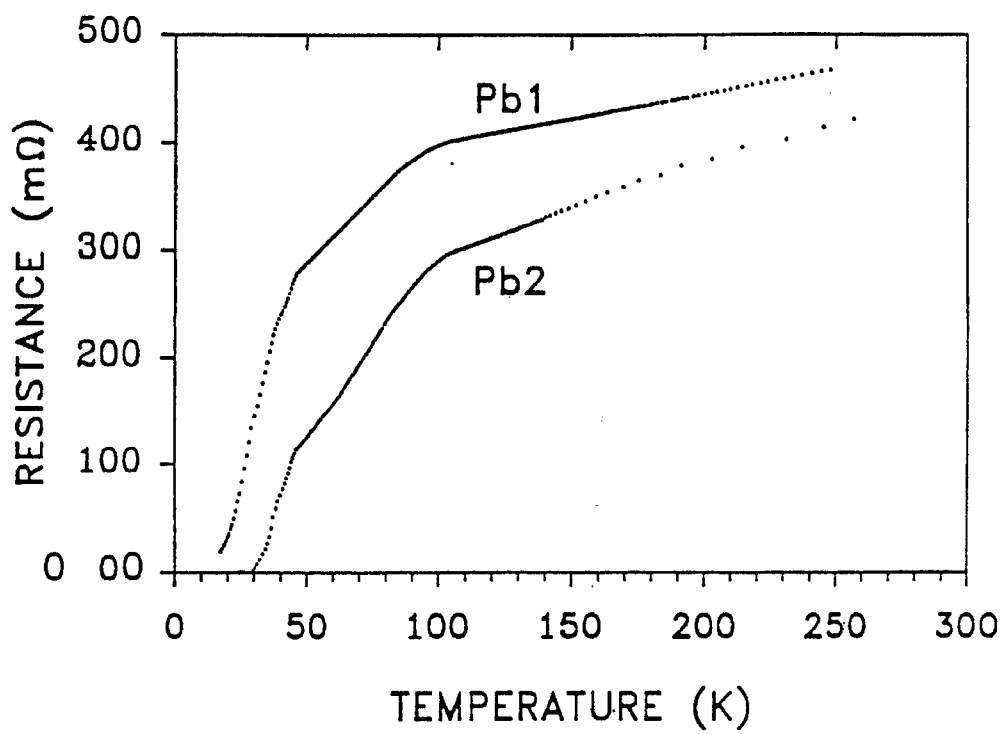
FIG. 3 illustrates resistance versus temperature for two Pb-doping samples with a nominal composition of $Pb_{0.5}Pr_2Tl_2Sr_3Cu_3O_{13}$.

FIG. 3 illustrates resistance-temperature dependence for two Pb-doping samples (Pb1 and Pb2), consisting of a nominal composition of $Pb_{0.5}Pr_2Tl_2Sr_3Cu_3O_{13}$. The samples were prepared using the method previously described.

Figure 4:
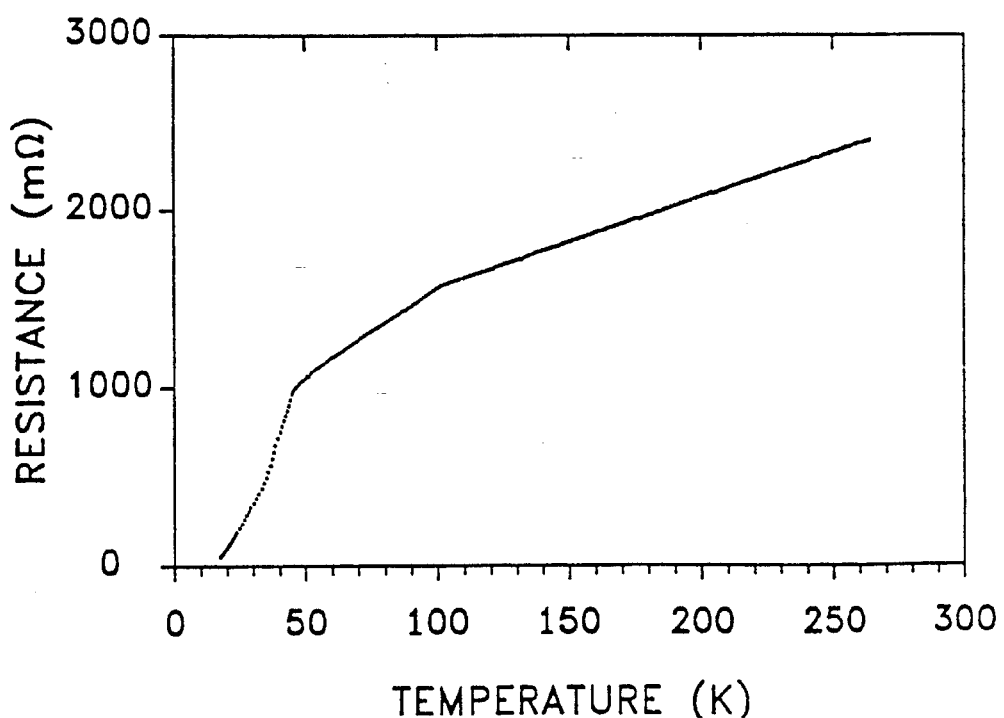
FIG. 4 illustrates resistance versus temperature for a nominal $KPb_{0.5}Pr_2Tl_2Sr_3Cu_3O_{13}$ sample.

As depicted in FIG. 3, both samples demonstrated a two-step superconducting transition at approximately 100K and 45K. The superconductivity at about 100K in these Ca-free samples was reproducible. Further, this onset temperature of around 100K was higher than other doping elements. This 100K superconducting transition was also observed in K-added Pb samples (K—Pb—R—Tl—Sr—Cu—O) as illustrated in FIG. 4.

Compared with the Pr—Tl—Sr—Cu—O sample system, Pb (or Pb, K)-doping Pr—Tl—Sr—Cu—O samples do exhibit a higher superconducting temperature (about 100K). The inventors believe that these results indicate that Pb has entered the lattice structure of the superconducting phase, and has changed the superconducting behavior of the samples. Further, the Pb-doped Pr—Tl—Sr—Cu—O samples did not contain calcium as do other superconductors with conductivity temperatures at about 100K. Accordingly, the Pb—Pr—Tl—Sr—Cu—O system may be the first Ca-free superconducting system with reproducible temperatures of about 100K.

The results also indicate that higher temperature superconductivity for Pb- and/or K-doping systems may be achieved by optimizing initial compositions and preparation conditions. Moreover, further elemental substitutions in these systems may lead to higher superconducting temperatures.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A superconducting composition comprising a composition having the nominal composition $Pb_{0.5}Pr_2Tl_2Sr_3Cu_3O_{13}$, said composition having a superconducting phase having an onset temperature of at least about 90° K.

2. A superconducting composition comprising: a composition having the nominal formula:

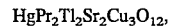

$HgPr_2Tl_2Sr_2Cu_3O_{12}$, said composition having an onset temperature of at least about 90° K. and exhibiting a two-step superconducting transition at about 88° K. and about 43° K., respectively.

* * * * *